United States Patent [19]

Asami et al.

[11] Patent Number: 4,817,418
[45] Date of Patent: Apr. 4, 1989

[54] FAILURE DIAGNOSIS SYSTEM FOR VEHICLE

[75] Inventors: Ken Asami; Kazunori Sakai, both of Nagoya; Shinichi Hori, Anjo; Noriyuki Nakashima, Nagoya; Yutaka Okuda, Kariya; Kimio Tamura, Anjo, all of Japan

[73] Assignees: Toyota Jidosha Kabushiki Kaisha; Nippondenso Co., Limited, both of Aichi, Japan

[21] Appl. No.: 113,327

[22] Filed: Oct. 26, 1987

Related U.S. Application Data

[63] Continuation of Ser. No. 861,867, May 12, 1986, abandoned.

[30] Foreign Application Priority Data

May 15, 1985 [JP] Japan .................................. 60-103066

[51] Int. Cl.⁴ ...................... G01M 19/00; G06F 11/00
[52] U.S. Cl. ........................................ 73/118.1; 371/29
[58] Field of Search .............. 73/118.1, 119 R, 119 A, 73/117.3, 117.2, 116; 364/550, 551; 340/52 F; 371/29, 15

[56] References Cited

U.S. PATENT DOCUMENTS

| 3,792,445 | 2/1974 | Bucks et al. | 73/117.3 |
| 4,271,402 | 6/1981 | Kastura et al. | 340/52 F |
| 4,398,258 | 8/1983 | Naitoh et al. | 364/551 |
| 4,497,057 | 1/1985 | Kato et al. | 371/29 |
| 4,621,335 | 11/1986 | Bluish et al. | 364/550 |
| 4,635,214 | 1/1987 | Kasai et al. | 364/551 |

FOREIGN PATENT DOCUMENTS 0199935 12/1982 Japan ...................................... 73/116

Primary Examiner—Michael J. Tokar
Assistant Examiner—Robert R. Raevis
Attorney, Agent, or Firm—Parkhurst, Oliff & Berridge

[57] ABSTRACT

A failure diagnosis system for a vehicle includes a failure detection means for detecting failures of devices or apparatuses installed in a vehicle, a storage means for storing failure information detected by the failure detection means, a failure display means for displaying failure information stored in the storage means, a time information means for adding failure information detected by the failure detection means and stored in the storage means to time information showing the time when the failure information is detected, a retrieval time input means for inputting a retrieval time and a selective display means for displaying selectively failure information which has time information being within the retrieval time.

5 Claims, 7 Drawing Sheets

FAILURE DIAGNOSIS SYSTEM FOR VEHICLE

This is a continuation of application Ser. No. 861,867 filed May 12, 1986, now abandoned.

BACKGROUND OF THE INVENTION

The present invention relates to a failure diagnosis system for a vehicle, which detects failures of various devices or apparatuses installed in a vehicle and which displays an indication of the failures.

A failure diagnosis system for a vehicle has been proposed, which detects failures of various devices or apparatuses installed in the vehicle, stores the failure information in non-volatile storage elements or the like and displays the failure information for use in future checking or repair of the vehicle. All parts of a vehicle which fail are displayed by the conventional system so that they can be repaired. Such a system enables the safety and riding comfort of the vehicle to be maintained.

However, in the previously proposed system, as failure information is stored in the non-volatile storage elements, parts which fail are continuously displayed as having failed even after the parts are repaired. Thus the problem arises that devices or apparatuses which are functioning properly are checked again or exchanged if the stored failure information is not eliminated after the parts which have failed have been repaired. To solve this problem, for example, a system has been proposed in Japan Patent Laid-open Bulletins No. Sho-56-34540, which eliminates the failure information from the non-volatile elements unless a signal showing that a device is out of order is detected again within a fixed time.

However, the above-mentioned system is ineffective because it still has the following problems. In the above-mentioned system, it is difficult to determine the fixed time for eliminating the failure information. Certain types of failure are known to occur in various situations. For example, certain devices malfunction only under specified use conditions. Another type of device always malfunctions because of broken wires or the like. Consequently, if all of the failure information stored in the elements is eliminated when failure is not detected for a fixed time, there is a possibility that even information concerning failed parts which have not been repaired is not displayed. This reduces the usefulness of the failure diagnosis system. On the other hand, if the fixed time is long enough to avoid the problem, the information regarding the failed parts which have already been repaired is continuously displayed so that the problem is not solved. Thus a rule of thumb concerning the fixed time does not solve the problem.

Furthermore, in the system which executes only a one-sided display, data which is necessary for repairing can not be selected resulting in a failure to provide sufficient servicing. For example, when a device frequently breaks, there may be a specific problem in the surroundings of the device. In this case, if all of the stored failure information is eliminated after a fixed time has elapsed, the useful information is also eliminated so that the parts which have failed are not completely but only temporarily repaired.

SUMMARY OF THE INVENTION

Accordingly, an object of this invention is to provide a novel failure diagnosis system for a vehicle, wherein failure information can be freely selected to attain improvement in service.

Another object of this invention is to provide a failure diagnosis system which has time information showing the time at which the failure information is generated so that only necessary failure information can be selected even when unnecessary information has not been eliminated and the situations of failure occurrence can be always accurately determined.

A further object of this invention is to provide the failure diagnosis system which offers great improvement in service, e.g., when there is a specific problem in the surroundings of a device, the device can be completely repaired because the history of the failure information is shown by combining the failure information with time information.

In order to achieve these objects, the failure diagnosis system for a vehicle according to this invention, as shown in the basic block diagram of FIG. 1, includes a failure detection means C1 for detecting failures of devices or apparatuses installed in a vehicle C, a storage means C2 for storing failure information detected by the failure detection means C1, a failure display means C3 for displaying failure information stored in the storage means C2, a time information additional means C4 for adding failure information detected by the failure detection means C1 and stored in the storage means C2 to time information showing the time when the failure information is detected, a retrieval time input means C5 for inputting a retrieval time, and a selective display means C6 for selecting and ordering the display means to display failure information which has additional time information which is within the retrieval time.

The failure detection means C1 of the invention is a means for detecting failures of various devices or apparatuses installed in a vehicle. The means includes the conventional failure detection means and furthermore includes a comparator for detecting abnormal conditions such as abnormal voltage of a power source, a condition in which a prescribed input signal is not inputted, a condition in which a temperature is beyond a prescribed range, a condition in which an actuator can not be actuated or the like, and various sensors.

The storage means C2 stores, when a failure of a device is detected by the failure detection means C1, the detected result and the after-mentioned time information showing the time when the failure is detected. In order to store the failure information, the means is at all times backed up by a battery of the vehicle C or has an internal power source or a large capacity condenser so as to prevent the storage information from being eliminated even after the key of the vehicle C is turned off. Moreover, it is desirable to use non-volatile storage elements which do not need the back-up of the above-mentioned power source, so that the composition of the circuit can be simplified.

The failure display means C3 is a means for displaying the failure information stored in the above-mentioned storage C2. The display means may have only one display part which changes e.g., a warning lamp changing from off to on in response to a failure or it may have a plurality of display parts responding to all sorts of failures. It thus becomes possible to examine the failure information stored in the storage means C2 by using the failure display means C3 so that the failure occurring in the vehicle C can be recognized.

The time information additional means C4 is a means for adding the failure information to the time information, when a failure is detected, showing the time of failure detection. The time information are also stored in the abovementioned storage means C2. The information, for example, which shows when and where a failure occurs, are necessary to repair the part which has failed. The time information shows the time when the failure occurred. Accordingly, the time information additional means C4 has, for example, a timer, a device for memorizing the absolute time when the failure occurs and a counter which counts the time from the failure occurrence time to the present. The absolute time is not always necessary for the time information, but the relative time when the failure occurs, which is obtained by the number of operation of an ignition key, the driving distance of a vehicle or the like, can be substituted for the absolute time.

The retrieval time input means C5 is a means for inputting the desired retrieval time. For the retrieval time input, the failure information with the time information is retrieved. The method for inputting the retrieval time may be suitably selected according to the form of time information used, as explained above. For example, if the absolute time is added to the failure information, the time period, e.g. the period from the present time to the time of failure, several hours or a few days, is input. If the relative time is added, the number of operations of the ignition key since the failure was detected, is input.

The selective display means C6 selects the required failure information, which is stored in the storage means C2, in accordance with the time period fixed by the retrieval time input means C5 and displays the selected results using the failure display means C3. Namely, the failure information which has the additional time information obtained for the fixed retrieval time period is displayed by the failure display means C3. The selective display means C6 selects the appropriate combination of the failure information and the time information. For example, the means C6 orders the display means to display simultaneously either the failure information and the additional time information for the fixed retrieval time period, or may display only the current failure information only.

BRIEF DESCRIPTION OF DRAWINGS

The above objects, features and advantages of the present invention will become more apparent from the description of the invention which follows, taken in conjunction with the accompanying drawings, wherein like reference numerals denote like elements, and wherein.

DETAILED DESCRIPTION OF PREFERRED EMBODIMENT

The present invention will be described in detail with reference to the accompanying drawings which illustrate a preferred embodiment of the present invention.

Figure 1:
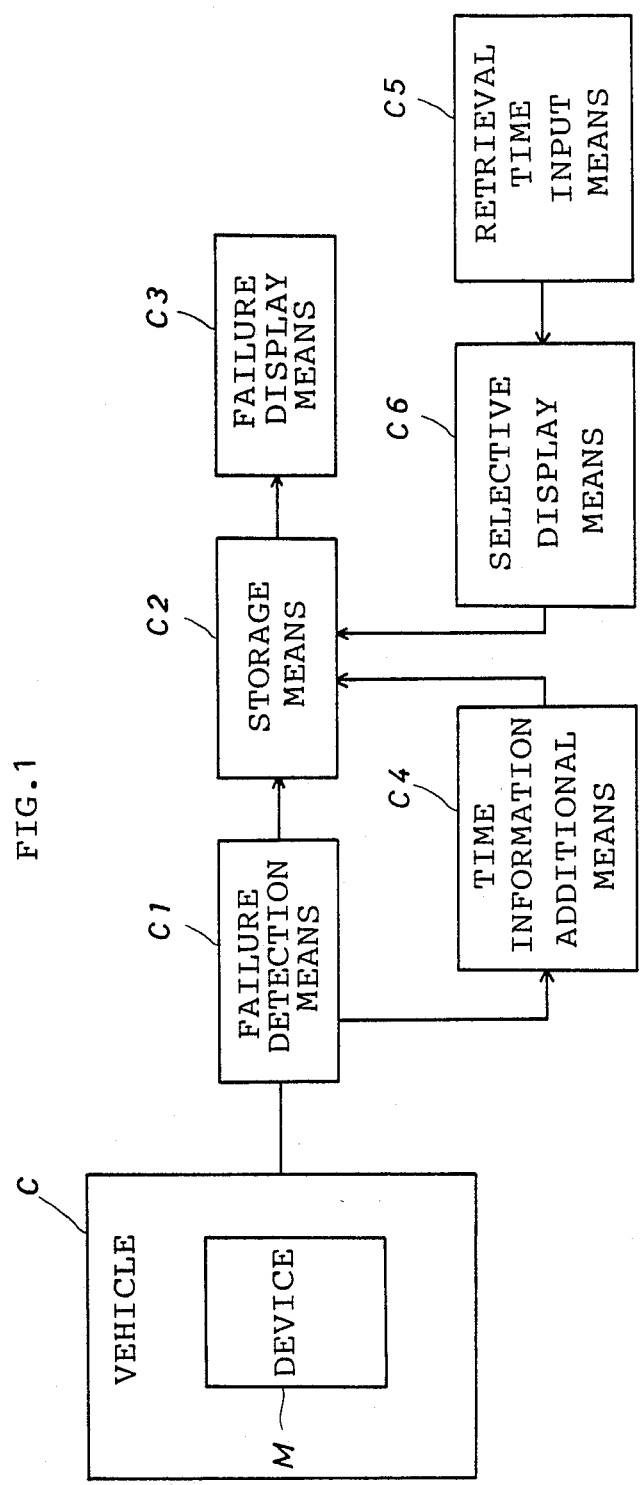
FIG. 1 is a basic block diagram embodying this invention.
Figure 2:
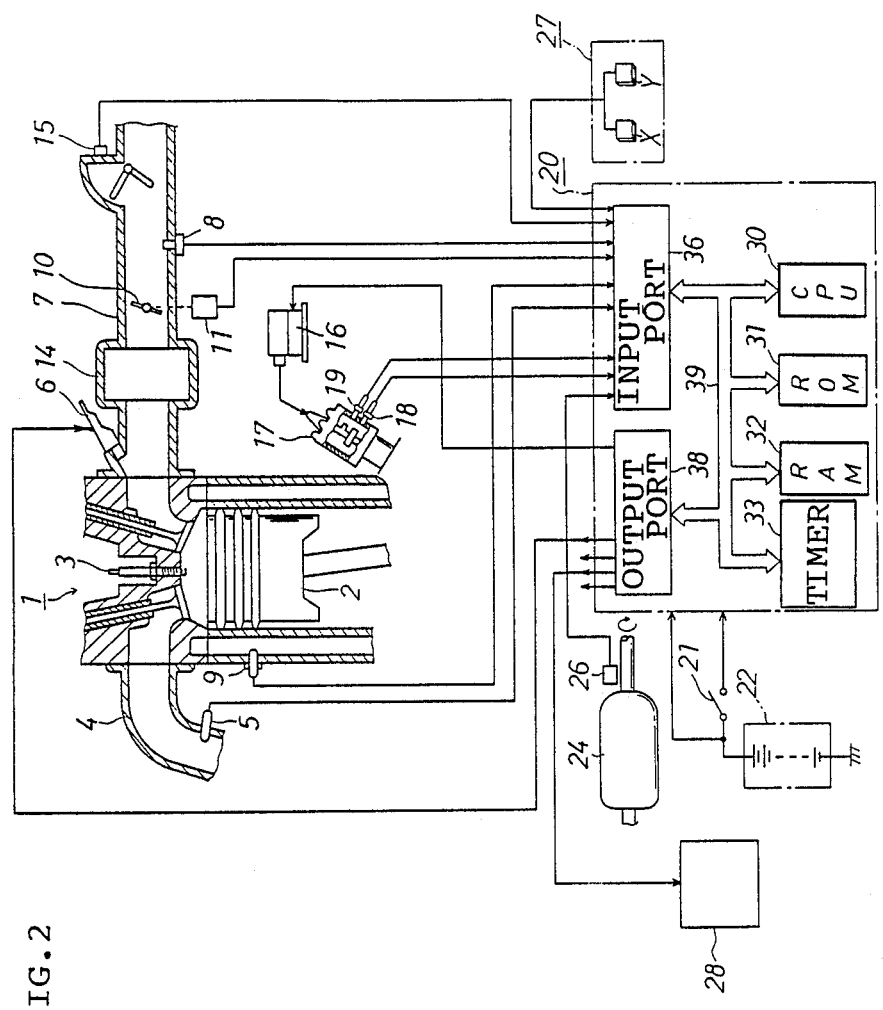
FIG. 2 is a block diagram showing a schematic device used in an embodiment of this invention.

FIG. 2 is a block diagram showing the internal combustion engine system including the failure diagnosis system for the vehicle of the preferred embodiment of the invention. Numeral 1 denotes the body of the internal combustion engine. Numeral 2 denotes a piston. Numeral 3 shows a spark plug. Numeral 4 shows an exhaust manifold. Numeral 5 denotes an oxygen sensor which is installed in the exhaust manifold 4 and which detects the residual oxygen concentration among the exhaust gas. Numeral 6 designates a fuel injection valve which injects fuel into the intake air in the internal combustion engine 1. Numeral 7 denotes an intake manifold. Numeral 8 shows an intake-air temperature sensor which determines the temperature of the intake air to be sent into the internal combustion engine 1. Numeral 9 denotes a water temperature sensor which detects the temperature of the internal combustion engine cooling water, THW. Numeral 10 shows a throttle valve. Numeral 11 shows a throttle sensor wherein the idle switch is installed and which detects the opening of the throttle valve 10. Numeral 14 shows a surge tank which absorbs the pulsation of the intake air. Numeral 15 designates an air flowmeter which measures the amount of intake air.

Numeral 16 denotes an igniter which generates the high-power voltage required to power the spark plug 3. Numeral 17 denotes a distributor interlocked with a crankshaft which is not illustrated. The distributor 17 distributes the high-power voltage generated in the igniter 16 to the spark plug 3 of each cylinder. Numeral 18 denotes a crank angle sensor installed in the distributor 17. The crank angle sensor 18 is a revolution speed sensor and generates twenty four pulse signals per one revolution of the distributor 17 or two revolutions of the crankshaft. Numeral 19 shows a cylinder discriminating sensor which generates one pulse signal per one revolution of the distributor 17. Numeral 20 shows an electronic control unit as the electronic control means. Numeral 21 denotes a key switch. Numeral 22 denotes a battery which supplies electric power to the electronic control unit 20 via the key switch 21 and which supplies electronic power to RAM 32 discussed below but not through the key switch 21 for the back-up. Numeral 24 shows a mounted transmission. Numeral 26 denotes a speed sensor which detects the vehicle speed from the revolution speed of the outputshaft of the transmission 24. Numeral 27 denotes a selective switch which forms a part of the failure diagnosis system for the vehicle. The selective switch 27 includes two pressure switches X and Y. As discussed below, the pressure switches X and Y are used to set a parameter K indicative of, for example, the number of times the ignition key switch has been turned on. The necessary failure information selected by pressure switches, X and Y, in the selective switch 27 is displayed on a failure display 28 installed in an indicator panel, which is placed on the front of a driver's seat.

The following are the explanations of the electronic control unit 20. Numeral 30 designates the Central Processing Unit (CPU) which receives and processes the data outputted from each sensor in accordance with the control program and executes the required processes for the operation and control of each device. Numeral 31 designates a Read Only Memory (ROM) which stores the control program and the initial data. Numeral 32 designates a Random Access Memory (RAM), where the data to be inputted into the electronic control unit 20 and the information required for the calculation control are temporarily read in or written out, and wherein the information is preserved by the back-up of the power source even after the key switch 21 is turned off. Numeral 33 denotes a timer which can periodically read the actual time and where a register (hereinafter referred to as Compare A) for generating the interrupt routine into the CPU 30, is installed. Numeral 36 denotes an input port to enter signals sent from each sensor. Numeral 38 denotes an output port which drives the igniter 16 and the fuel injection valve 6 installed in each cylinder and outputs the information to the failure display 28. Numeral 39 denotes a common bus which joins each of the elements with one another. The input port 36 includes the analog input part and the pulse input part neither of which are illustrated. In the analog input part, analog signals from the oxygen sensor 5, the intake-air temperature sensor 8, the water temperature sensor 9, the throttle sensor 11 and the air flowmeter 15 are converted to digital signals and entered into the unit. In the pulse input part, the pulse signals from the idle switch, which is not shown, installed in the throttle sensor 11, the crank angle sensor 18, the cylinder discriminating sensor 19 and the selective switch 27 are entered into the unit. When the port 38 is instructed to start the fuel injection by the CPU 30, the output port 38 outputs the control signal to open the fuel injection valve 6. The control signal is continuously outputted until the output port 38 receives the instruction signal from the CPU 30 to stop the fuel injection. The instruction signal to stop the fuel injection is generated only at the fuel injection stop time, established in the Compare A or register of the timer 33 by the CPU 30, coincides with the real time counted by the timer 33.

In the internal combustion engine system constructed as described above, when the internal combustion engine is started by the starter, (not shown), by supplying electric power from the battery 22 via the key switch 21, the optimum opening time period of the fuel injection valve 6, i.e., the optimum amount of fuel injection, is calculated using the output values from each sensor so that the internal combustion engine 1 operates properly. The ignition timing of the spark plug 3 is also carefully controlled in accordance with the driving condition, and the optimum control according to each driving condition of the internal combustion engine is selectively executed. The optimum control includes, for example, the closed-loop control by the output of the oxygen sensor 5, i.e., air-fuel ratio feedback control, cold time control, starting time control or power increasing control.

Figure 3A:
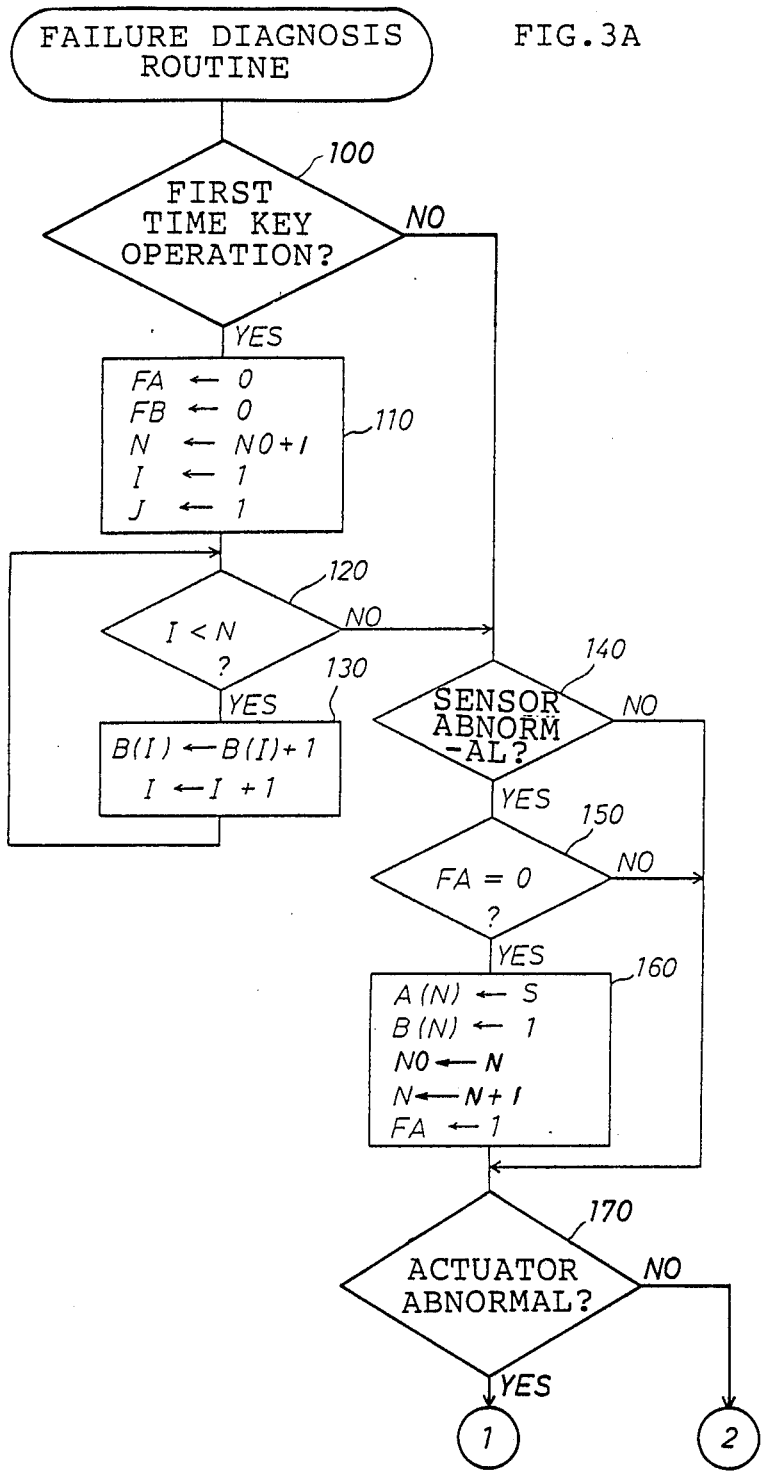
FIGS. 3A and 3B are flowcharts of the failure diagnosis routine in the embodiment of FIG. 2.
Figure 3B:
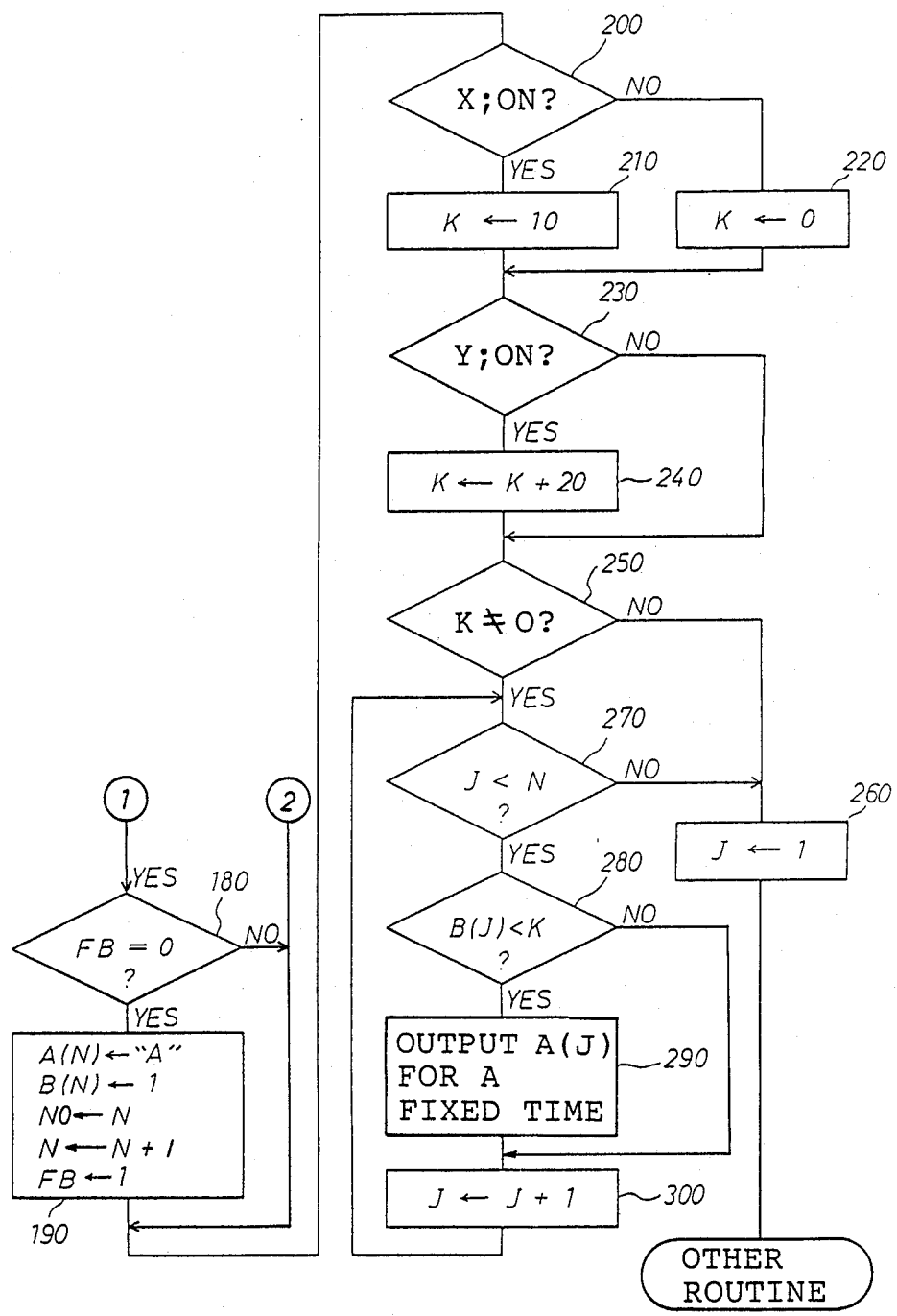

To execute each of the abovementioned controls, it is necessary that normal signals are detected from each sensor and that each actuator is functioning normally in response to the output from the electronic control unit 20. Consequently, the electronic control unit 20 functions to judge whether or not the required conditions are satisfied and stores, if some failure is detected, the failure information into RAM 32 backed up by the power source. The failure diagnosis system for the vehicle works as explained in the foregoing description, and the CPU 30 operates in accordance with the failure diagnosis routine program. The flowcharts, shown in FIGS. 3 (A) and 3(B), are previously stored in ROM 31.

The following is the detailed explanation of the failure diagnosis routine. This routine is repeatedly executed by the CPU 30 at every fixed time or at every fixed revolution angle of the internal combustion engine 1. For example, the routine may form a part of the main program for controlling the internal combustion engine system, which determines the abovementioned fuel injection time or the ignition timing, or it may interrupt the main program for a fixed time from the timer 33, in order to be repeatedly executed by the CPU 30. When the program enters the failure diagnosis routine after the start of the internal combustion engine 1, first at step 100 it is determined if the key switch 21 is triggered to start the internal combustion engine 1 for the first time. The number of operations of the key switch 21, i.e. the number showing how many times the vehicle repeats the stop and start operation, is used as information of the time of the failure, as described below. Thus, step 100 is necessary because it accurately determines that the key switch 21 was triggered only once, even if the routine is executed twice during one operation of the key switch 21. If it is determined at step 100 that the key switch 21 was triggered for the first time, the program proceeds to steps 110 thru 130 where the initialization characteristic of the start time of the internal combustion engine 1 is executed, and if not, the program proceeds to step 140 where the failure detection process starts.

Referring to the initializing steps, flags (FA, FB) and variables (N, I, J) are initialized at step 110; the flags, FA and FB, are reset, the variables for counting, I and J, are set equal to 1 and the variable N is set to the value of NO+1 (i.e., when NO=0 no errors have been detected) which is backed up by RAM 32 and calculated in the prior execution of this routine. NO is incremented every time the failure is detected as described below so as to show the number of failures occurring in the internal combustion engine system. Accordingly, prior to detection of the first failure, NO=0. At step 130 a variable B(I) (which is preset to 1 at step 160 or 190) is successively incremented while the variable for counting, I, is incremented one by one until, at step 120, it is determined that the variable I is equal to the variable N. The variable B(I) (I=1,2, ..., N−1) denotes the information of the time of the failure. For example, if B(I) is equal to 3, it shows that after the failure occurred, the key switch 21 was triggered twice to start the internal combustion engine 1. Consequently, if the key switch 21 is now triggered again, the value of B(I) is incremented. It should be apparent that the initial value of B(I) (i.e., the value of B(I) prior to detection of the first failure) is equal to 0. After the incremental process the program proceeds to step 140.

Step 140 thru step 190 are steps for detecting failures. At step 140 it is determined if the sensor which is the object of the failure diagnosis system, e.g. the oxygen sensor 5, the water temperature sensor 9 or the like, is functioning abnormally. For the detection of the abnormality, any conventional method may be selected. For example, the determination of whether the fixed signal pattern to be sent from the sensor immediately after the starting is detected within the prescribed time can be used or the determination of whether the signal from the sensor shows a value which can not be actually generated can be used. If at step 140 a failure of the sensor is not detected, the program proceeds to step 170, and if a failure is detected the program proceeds to step 150 where it is determined if the flag FA is zero. If the flag FA is equal to zero, at step 160 the character "S" is stored into the variable A(N) and the variable B(N) is set equal to 1 as the time information so that the information concerning failure detection and time is stored. Further, at step 160, the variables N and NO are incremented for the following steps and the flag FA is set equal to 1 so as not to detect again the same failure of the sensor. Step 170 detects or judges the failure of the actuator which is the another object of the failure diagnosis system. For this detection or judgement of failure, any method can be selected as for the judgement at step 140. For example, a determination of whether or not the hydraulic pressure and the power source necessary for driving the actuator are normal or a detection of whether or not the actuator is operated in response to the driving signal can be used. If the failure is detected at step 170, at steps 180 and 190, the information, concerning failure detection and time is stored and the variables and the flags are controlled as in the abovementioned steps 150 and 160. However, in this case, to avoid the confusion with the failure detection of the sensor, A(N) is set to the character "A" instead of the character "S" and the flag FB is used instead of the flag FA.

After the failure of the sensor or the actuator is detected and stored as described above, or when a failure is not detected, the program proceeds to step 200 where the failure display process starts. It is determined, at step 200 if the pressure switch X in the selective switch 27 is turned on. If the switch X is turned on, the variable K is set equal to 10 at step 210, and if not, the variable K is set to zero at step 220. In the same manner, at step 230 it is determined if the pressure switch Y in the selective switch 27 is turned on. If the switch Y is turned on, the variable K is set equal to the value previously stored in K plus 20 at step 240. Consequently, the variable K is set to four kinds of values in response to the operation of the pressure switches; K is set equal to zero when either switch switch X is operated, K is set equal to 20 when only the pressure switch Y is operated and K is set equal to 30 when both switches are operated. If it is determined at step 250 that the variable K is equal to zero, the variable J is set equal to 1 at step 260 and the program exits from this routine, but if K is not equal to zero at step 250, then the program proceeds to steps 270 thru 300 to display failure information on the failure display 28.

In the failure display steps, the variable J set to 1 at step 110 is incremented one by one at step 300 until it is determined at step 270 that J is equal to the variable N. Other steps are concurrently executed. At step 280 it is determined if the variable B(J) showing the time information is less than K which is set as described above, thus determining whether or not B(J) shows up-to-date time information within the range set in K. If B(J) is less than K, then A(J) is displayed for a fixed time on the failure display 28 at step 290, J is incremented at step 300 and the program returns to step 270. The programs executed at these steps, i.e. steps 270 thru 300, are repeated until the value J becomes greater than or equal to the value N, and the up-to-date failure information A(J) is displayed. Consequently, only the failure information which is up-to-date information within the time set in K is displayed on the failure display 28. For example, while K is set equal to 10, if failure information is generated in a sensor as the up-to-date information whose value is less than the number of operation of the key switch 21, i.e. 10 times, the character "S" is displayed. Step 260, which is a step for setting again the variable J equal to 1, is a fail-safe step. When processing of this routine stops, i.e. when the CPU 30 is reset because of the turning-off of the key switch 21, in the middle of executing the display of the failure information on the failure display 28, the variable J is initialized again to be set equal to 1 so that the display of the failure information is executed again from the beginning.

As clearly shown in the foregoing explanation, in the failure diagnosis system for the vehicle of this embodiment, as A(N) showing failure information, B(N) showing time information and NO showing the number of failures are at all times stored in the RAM 32 and the pressure switches X and Y for setting a desired retrieval time are installed, the required failure information can be obtained out as needed. Consequently, there are advantages such as a part of a sensor or an actuator which fails that has been already repaired is not detected again as a failure part and the failure can be easily detected. Moreover, as shown in FIG. 2, since no special devices or apparatuses are necessary to construct the failure diagnosis system, the system can be very easily installed in conventional vehicles. In this embodiment, failure detection is performed only for a sensor and an actuator, but of course it is possible to detect failures occurring in various sensors and actuators if steps 140 thru 190 are executed for each of those sensors and actuators.

In another embodiment of the invention, if the driving distance of the vehicle or the time at which the failure is detected is stored in the abovementioned variable B(N), instead of the number of operations of the key, and K is set to the desired driving distance or time, the time of failure can be more accurately specified. Accordingly, it is possible to select only new failure information, which is determined by comparing with the time when the failure part was repaired or the driving distance at that time, and display only such information on the failure display 28. It is also possible to know the history of the failure information based on the time information so as to judge in which part failure is apt to occur.

The method for diagnosing failures occurring in the driving control system of the internal combustion engine is explained in detail above. However, this failure diagnosis system can be also utilized for failures occurring in devices having various functions installed in the vehicle.

Figure 4:
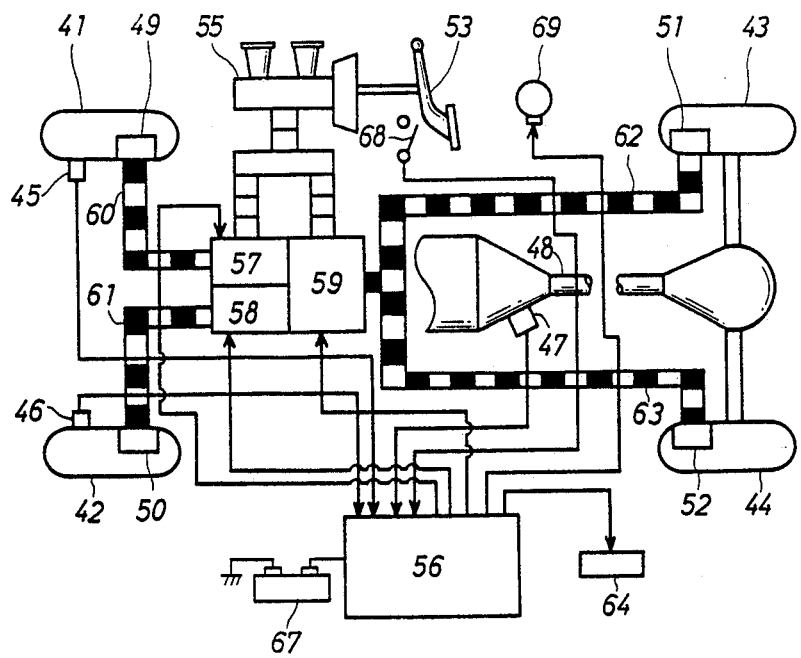
FIG. 4 is a schematic block diagram showing an anti-skid controller in the embodiment of FIG. 2.

Referring now to FIG. 4, a schematic block diagram showing the whole construction of an anti-skid controller is illustrated.

In FIG. 4, numerals 41 thru 44 designate the wheels of a vehicle. Numeral 41 shows a right-front wheel, numeral 42 shows a left-front wheel, numeral 43 shows a right-rear wheel and numeral 44 shows a left-rear wheel. Numerals 45 thru 47 designate vehicle speed sensors corresponding to each wheel speed detection means, namely electromagnetic pickup means or photoelectric transfer means of vehicle speed sensors to detect each wheels revolution speed. The right-front wheel speed sensor 45, mounted around the right-front wheel 41, generates signals in response to the revolution of the right-front wheel 41. The left-front wheel speed sensor 46, mounted around the left-front wheel 42, generates a signal in response to the revolution of the left-front wheel 42. The rear wheel speed sensor 47, mounted on a propeller shaft 48 transferring power to the right-rear wheel 43 and the left-rear wheel 44, which are driving wheels, generates a signal in response to the revolution of the propeller shaft 48, corresponding to the average number of revolutions of the right-rear wheel 43 and the left-rear wheel 44. These signals are regarded as each wheel speed signal.

Numerals 49 thru 52 denote hydraulic-pressure brake devices for each wheel. The hydraulic-pressure brake devices 49, 50, 51 and 52 are installed in the right-front wheel 41, the left-front wheel 42, the right-rear wheel 43 and the left-rear wheel 44, respectively. Each hydraulic-pressure brake device 49 thru 52 works to break each wheel 41 thru 44 in response to hydraulic-pressure from a hydraulic-pressure cylinder 55, which generates hydraulic-pressure in response to the operation of a brake 53. The hydraulic-pressure from the hydraulic-pressure cylinder 55 is suitably reduced, retained or intensified so that the anti-skid of each wheel is obtained by actuators 57 thru 59 controlled by the after-mentioned electronic control unit 56 in order to provide the high braking. Numeral 57 is a right-front wheel actuator corresponding to the hydraulic-pressure brake device 49 of the right-front wheel 41, numeral 58 is a left-front wheel actuator corresponding to the hydraulic-pressure brake device 50 of the left-front wheel 42 and numeral 59 is a rear wheel actuator corresponding to the hydraulic-pressure brake devices 51 and 52 of the rear-wheels 43 and 44.

Numerals 60 thru 63 are hydraulic-pressure conduits which conduct the adjusted pressed-fluid from the actuators 57 thru 59 to the hydraulic-pressure brake devices 49 thru 52. Numeral 60 denotes a hydraulic-pressure conduit installed between the right-front wheel actuator 57 and the hydraulic-pressure brake device 49 of the right-front wheel 41. Numeral 61 denotes a hydraulic-pressure conduit installed between the left-front wheel actuator 58 and the hydraulic-pressure brake device 50 of the left-front wheel 42. Numeral 62 denotes a hydraulic-pressure conduit installed between the rear wheel actuator 59 and the hydraulic-pressure brake device 51 of the right-rear wheel 43. Numeral 63 denotes a hydraulic-pressure conduit installed between the rear wheel actuator 59 and the hydraulic-pressure brake device 52 of the left-rear wheel 44.

Figure 5:
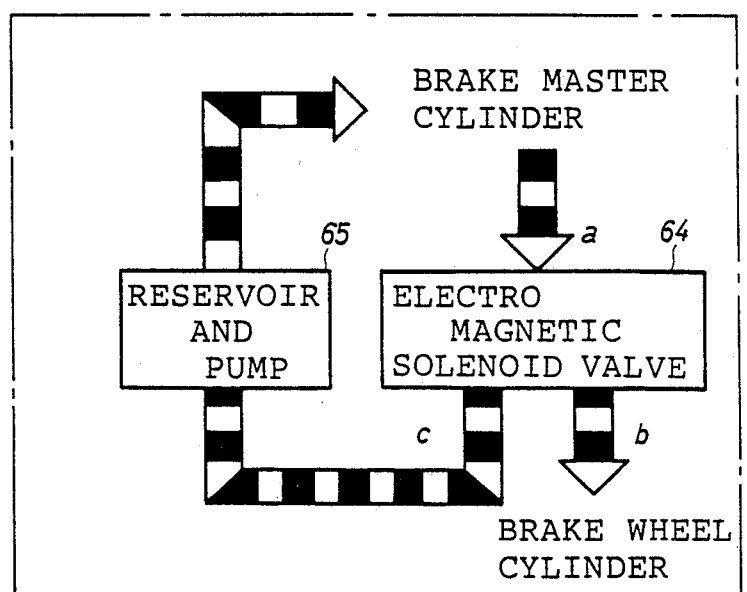
FIG. 5 is a partial detailed view showing a hydraulic system in the embodiment of FIG. 2.

The right-front wheel actuator 57, the left-front wheel actuator 58 and the rear wheel actuator 59 include, as shown in FIG. 5, an electromagnetic solenoid valve 64 which varies the hydraulic-pressure into the intensifying, retaining or reducing mode and a pump 65 including a reservoir which temporarily stores brake-pressed-fluid when the brake pressure is reduced and runs back in the direction of a master cylinder. The hydraulic-pressures generated from each actuator 57 thru 59 are transmitted to the brake wheel cylinder of each hydraulic-pressure brake device 49 thru 52 via each hydraulic-pressure conduit to apply the brake to each wheel 41 thru 44. The electromagnetic solenoid valve 64 in each actuator is composed of a three-position valve, if observed from the side of the brake wheel cylinder. The valve enables three modes which are the intensifying mode (a−b) communicating with the brake master cylinder side, the reducing mode (b−c) communicating with the side of the pump 65 and the retaining mode disconnected with the either side.

The electronic control unit 56 is actuated by power from a battery 67 to enter various input signals referring to the braking condition of a vehicle, such as speed signals from the vehicle speed sensors 45 thru 47 or signals from a stop-switch 68 which detects the braking operation of a brakepedal 53, and which outputs the control signals on the basis of the input signals to various control devices. In this case the actuators 57 thru 59 control the brake pressure. The electronic control unit 56 also controls an indicator lamp 69 which informs a driver of a failure in a system, when a failure such as breaking of wire occurs in at least one of the actuators 57 thru 59, or a short circuit or a broken wire occurs in the wheel speed sensor 45, 46 or 47.

Figure 6A:
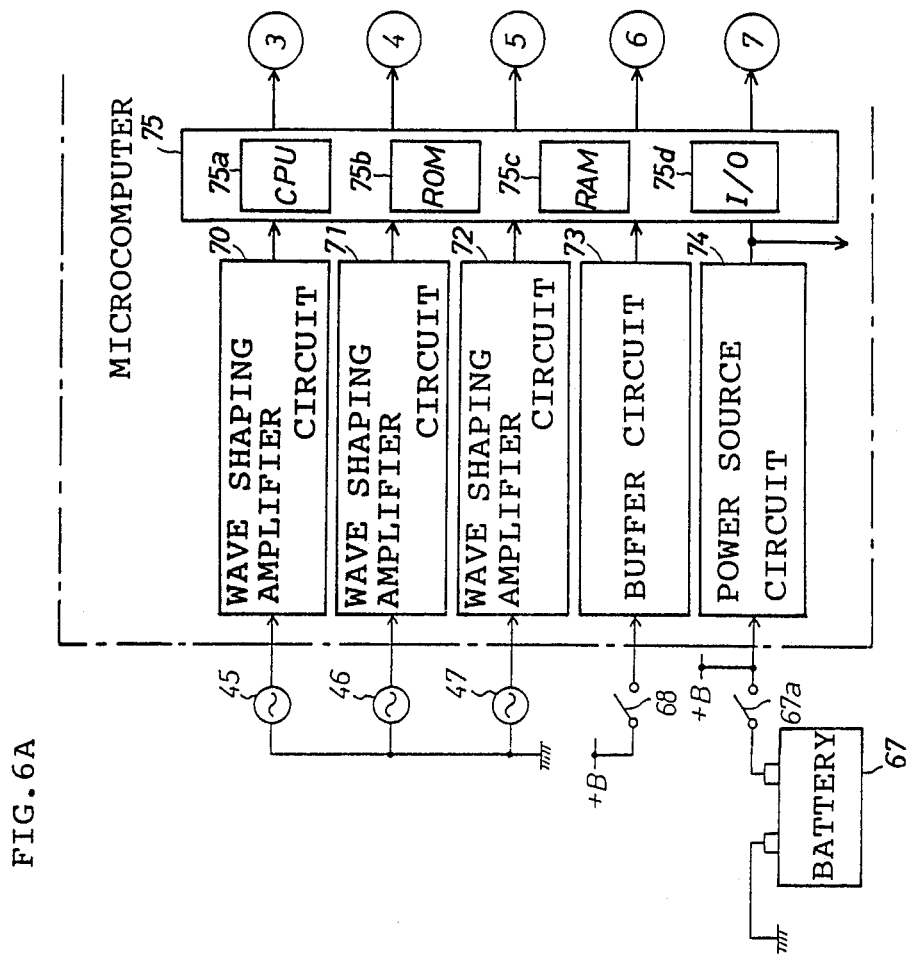
FIGS. 6A and 6B are block diagrams showing the control unit in the embodiment of FIG. 2.
Figure 6B:
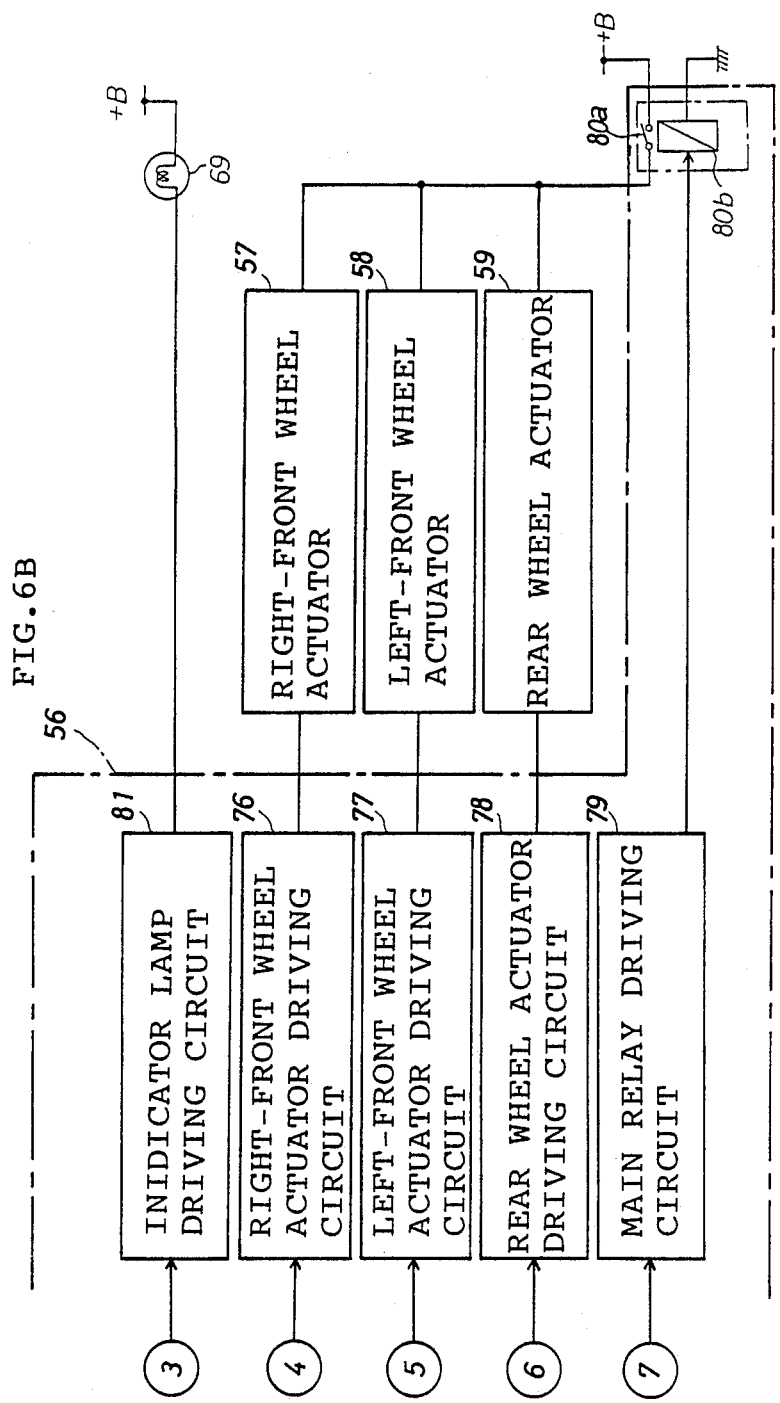

Referring now to FIGS. 6(A) and 6(B), the construction of the electronic control unit is illustrated. In the drawings, numerals 70 thru 72 show wave shaping amplifier circuits. The wave shaping amplifier circuit 70 alters a signal from the vehicle speed sensor 45 into an pulse signal adequate for processing by a micro-computer 75, and other wave shaping amplifier circuits 71 and 72 work in the same manner. Numeral 73 shows a buffer circuit electrically connected with the stop switch 68. Numeral 74 is a power source circuit which supplies source voltage, which is provided from the battery 67 when an ignition switch 67a is turned on, as constant voltage to the whole device. Numeral 75 shows a conventional micro-computer including CPU 75a, ROM 75b, RAM 75c, and I/O circuit 75d. Numerals 76 thru 79 and numeral 81 are driving circuits which generate signals in response to control signals from the micro-computer 75. Numeral 76 shows a right-front wheel actuator driving circuit for operating the electromagnetic solenoid valve of the right-front wheel actuator 57. Numeral 77 shows a left-front wheel actuator driving circuit for operating the electromagnetic solenoid valve of the left-front wheel actuator 58. Numeral 78 denotes a rear wheel actuator driving circuit for operating the electromagnetic solenoid valve of the rear wheel actuator 59. Numeral 79 denotes a main relay driving circuit which applies electric current to a coil 80b of a main relay 80 having a normally open contact 80a to turn the normally open contact 80a on. Numeral 81 shows an indicator lamp driving circuit for turning the indicator lamp 69 on. If there is any chance that the electronic control unit 56 is broken, the main relay 80 prevents driving circuits 76 thru 78 from driving the actuators 57 thru 59, respectively, thus preventing the anti-skid control.

In the anti-skid controller, the indicator lamp 69 is turned on when a failure such as a broken wire in the controller is detected by the self failure diagnosis function, as conventionally known. However, if a failure occurs in an actuator or a sensor of the anti-skid controller and the number of operations of the ignition key is simultaneously stored as failure and time information in the CPU 75a of the micro-computer 75 installed in the anti-skid controller, in accordance with the above-mentioned flowcharts in FIGS. 3(A) and 3(B), it is possible to inform a driver not only of a failure in the anti-skid controller but also accurately in what sensor or actuator the failure has occurred. Moreover, since the time information showing when the failure occurred is simultaneously provided, a driver can judge as to which part of the anti-skid controller failure is apt to occur and accurately know which failure part has been already repaired, so that the quality of service is greatly improved.

In the embodiment described above, the failure diagnosis routine for the anti-skid controller is executed only by the CPU 75a. However, this does not limit or restrict the construction of the failure diagnosis system. For example, the routine may be executed not only by the CPU 75a but also by the CPU 30 by means of communicating with the abovementioned electronic control unit 20.

While the preferred embodiment of the invention has been described, it is to be understood that the invention is not limited thereto, and may be otherwise embodied within the scope of the following claims.

What is claimed is:

1. A failure diagnosis system for a vehicle comprising:
   a failure detection means for detecting failure of vehicle components, said failure detection means outputting failure information;
   a storage means for storing the failure information outputted by said failure detection means;
   a failure display means for displaying the failure information stored in said storage means;
   a time information additional means for combining time information indicative of the time when failure of vehicle components is detected with said failure information outputted by said failure detection means, said time information means outputting time of failure information to said storage means;
   retrieval time input means for selecting a retrieval time; and
   a selective display means for selectively displaying a combination of failure information and time information within said retrieval time.

2. The failure diagnosis system of claim 1, wherein a measurement of the distance driven by the vehicle is used as the time information.

3. The failure diagnosis system of claim 1, wherein a counter is used to count the number of operations of an ignition switch in said vehicle and wherein the number of operations of the ignition switch is used as the time information.

4. The failure diagnosis system of claim 1, wherein said time information means comprises a timer.

5. The failure diagnosis system of claim 1, wherein said time information means comprises a counter.

* * * * *